United States Patent [19]

Hashimoto

[11] Patent Number: 4,628,340
[45] Date of Patent: Dec. 9, 1986

[54] CMOS RAM WITH NO LATCH-UP PHENOMENON

[75] Inventor: Kazuhiko Hashimoto, Tokyo, Japan

[73] Assignee: Tokyo Shibaura Denki Kabushiki Kaisha, Kawasaki, Japan

[21] Appl. No.: 468,209

[22] Filed: Feb. 22, 1983

[51] Int. Cl.$^4$ .................... H01L 29/78; H01L 27/02
[52] U.S. Cl. .................................. 357/42; 357/23.1; 357/41; 357/88
[58] Field of Search ............. 357/41, 42, 88, 20, 357/23.1

[56] References Cited

U.S. PATENT DOCUMENTS

| 3,916,430 | 10/1975 | Heumer et al. | 357/41 |
| 4,229,756 | 10/1980 | Sato et al. | 357/42 |
| 4,233,672 | 11/1980 | Suzuki et al. | 357/42 |
| 4,314,857 | 2/1982 | Aitken | 357/42 |

FOREIGN PATENT DOCUMENTS

| 56-49572 | 5/1981 | Japan | 357/42 |
| 56-146287 | 11/1981 | Japan . | |
| 58-48959 | 3/1983 | Japan . | |

OTHER PUBLICATIONS

Y. Sakai et al., "High Packing Density High Speed CMOS (Hi-CMOS) Device Technology" *Japanese Journal of Applied Physics*, vol. 18 (1979), Supplement 18-1, pp. 73-78.

*Primary Examiner*—J. Carroll
*Attorney, Agent, or Firm*—Finnegan, Henderson, Farabow, Garrett & Dunner

[57] ABSTRACT

A complementary-symmetry metal-oxide semiconductor device is made of a semiconductor substrate of a first conductivity type and well regions of a second conductivity type formed in the surface region of the semiconductor substrate. The well regions consist of a first well region and a second well region having a lower resistance per unit area than the first well region. An input-output peripheral circuit is formed of the second well region and the substrate. An internal circuit is formed of the first well region and the substrate.

5 Claims, 2 Drawing Figures

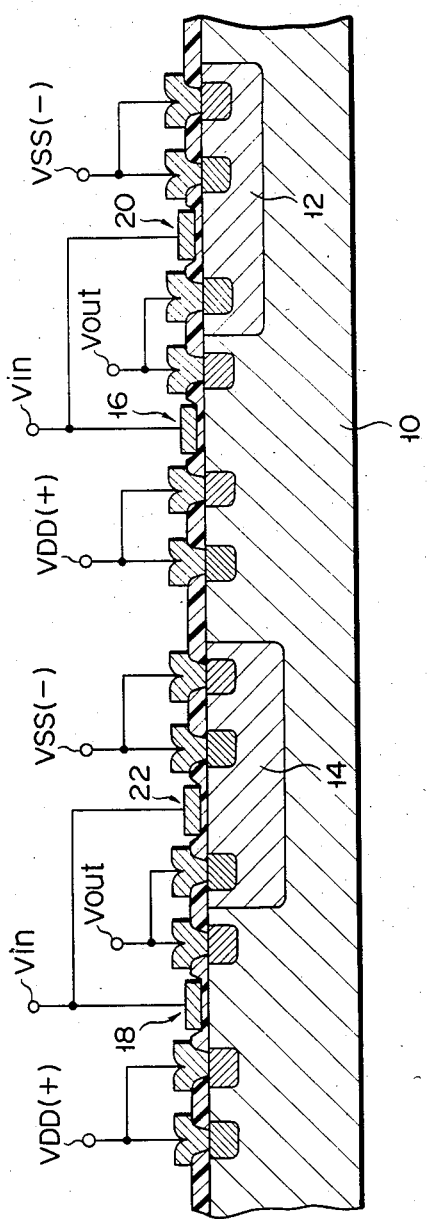
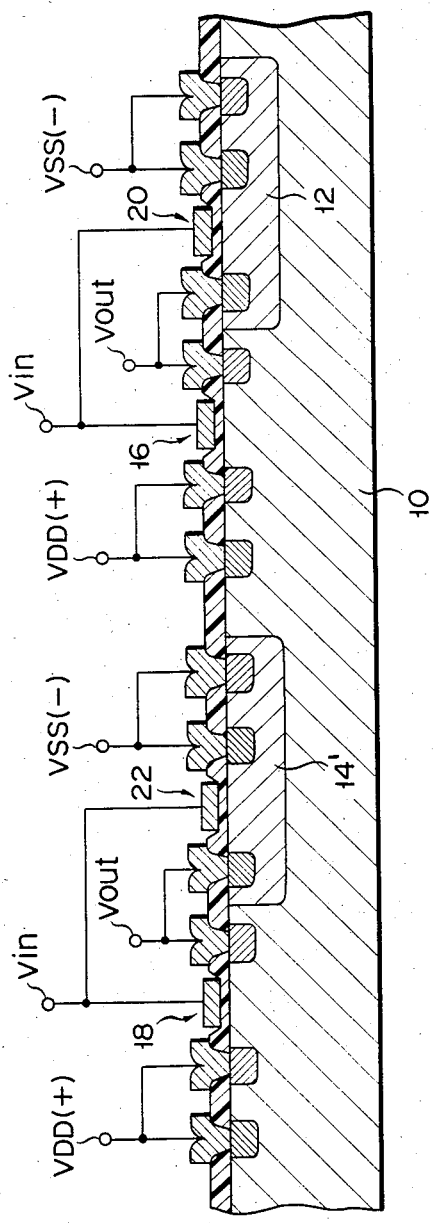

CMOS RAM WITH NO LATCH-UP PHENOMENON

BACKGROUND OF THE INVENTION

1. Field of the Invention

This invention relates to a complementary-symmetry metal-oxide semiconductor device (hereinafter referred to as a "CMOS device").

2. Description of the Prior Art

In recent years, an increasing demand has been made for a CMOS device which has various merits such as low power consumption and stability with respect to power source voltage fluctuations. Formerly, the CMOS device has had some drawbacks. At present, however, the defects, except for the latch-up phenomenon, have been resolved. With a P well type CMOS device, the latch-up phenomenon designates an objectionable condition in which current can flow freely from a power source VDD to the ground VSS through a lateral type parasitic PNP transistor appearing in an N type substrate and a vertical parasitic NPN transistor appearing in a P well. Both parasitic transistors are connected together at the base and collector regions, creating a PNPN thyristor. When the thyristor is rendered conductive by external electrical noise, a current begins to flow and continues at an increasing rate, until the power source VDD is cut off. As a result, the original function of the CMOS device is impaired, possibly causing the CMOS device to be destroyed by the high heat arising from the flow of large currents.

As described above, the occurrence of the latch-up phenomenon results when a thyristor is rendered conductive by external noises incident on the device over a long period of time. Therefore, the prevention of the latch-up phenomenon consists in the suppression of the occurrence of at least one of the above-mentioned factors. A conventional process for avoiding the latch-up phenomenon comprises separating the MOS regions of the respective channel types in order to suppress the formation of a thyristor. A CMOS/SOS device constructed by mounting a CMOS element on a sapphire substrate is a typical example of the above-mentioned process. However, this device has the drawback that its manufacture involves a complicated process.

Another conventional process proposed for the suppression of the latch-up phenomenon comprises constructing a device by interposing an insulation layer between the respective MOS regions. However, this process is accompanied by the drawback that the degree of integration is reduced. Still another conventional process comprises extending the base region of a transistor to suppress the condition which may lead to the conduction of a thyristor. This process indeed has the advantages that because the degree of current amplification by a transistor drops with increasing conduction length, the thyristor is less likely to be rendered conductive. But the last mentioned process still has the drawback that the degree of integration is decreased.

SUMMARY OF THE INVENTION

It is accordingly the object of this invention to provide a semiconductor device of a simple arrangement which can suppress the occurrence of the latch-up phenomenon without decreasing the degree of integration.

To attain the above-mentioned object, this invention provides a semiconductor device which comprises a semiconductor substrate of a first conductivity type, a first well region of a second conductivity type formed in the surface region of the semiconductor substrate, a second well region of the second conductivity type formed in the surface region of the semiconductor substrate with a lower resistance per unit area than the first well region, a first complementary-symmetry MOS circuit formed of the first well region and semiconductor substrate, and a second complementary-symmetry MOS circuit formed of the second well region and semiconductor substrate.

BRIEF DESCRIPTION OF THE DRAWINGS

FIG. 1 is a cross sectional view of a semiconductor device according to a first embodiment of this invention; and FIG. 2 is a cross sectional view of a semiconductor device according to a second embodiment of the invention.

DETAILED DESCRIPTION OF THE PREFERRED EMBODIMENTS

Description will now be given with reference to FIG. 1 of a CMOS device according to a first embodiment of this invention. FIG. 1 is a cross sectional view of the first embodiment. First and second well regions 12, 14 of P type silicon are formed in the surface region of an N type silicon substrate 10. The semiconductor hatchings which are directed from the right upper side to the left lower side represent an N type, while the semiconductor hatchings which are directed from the left upper side to the right lower side denote a P type. The first and second well regions 12, 14 contain an impurity having a concentration of $7 \times 10^{15}/cm^3$. First well region 12 has a depth of 5 μm, and second well region 14 has a depth of 8 μm. Thus both well regions have different resistance values per unit area, namely, the first well region has a resistance of about 9 kΩ and the second well region has a lower resistance of over 6 kΩ. P channel MOSFETs 16, 18 are formed in the surface region of the substrate 10. N channel MOSFETs 20, 22 are respectively formed in the surface regions of the first and second well regions. In practical application, the MOSFETs 16, 18, 20, 22 are respectively provided in a large number, though FIG. 1 shows only one of the respective groups of the MOSFETs. N channel MOSFETs 16 and P channel MOSFETs constitute first CMOSFETs. P channel MOSFETs 18 and N channel MOSFETs 22 constitute second CMOSFETs.

The latch-up phenomenon arises in the first and second CMOSFETs at different rates. This is because though both CMOSFETs are formed in the same N type substrate 10, and the P type well regions have a different resistance values per unit area compared to the N type well regions. The P type well region acts as the substrate of the N channel MOSFET. The conduction of the thyristor which is counted as one of the aforementioned three factors in the occurrence of the latch-up phenomenon is more likely to take place when the substrate of the MOSFET has a higher resistance because the thyrister is turned on by a voltage-drop occurring in the substrate because of external noises.

With respect to the above-mentioned first embodiment of this invention shown in FIG. 1, the second well region 14 has a lower resistance per unit area than the first well region 12. Consequently, the latch-up phenomenon is less likely to take place in the second CMOSFETs constituted by the second well region 14 and substrate 10, than in the first CMOSFETs. However, the second CMOSFETs are handicapped by a lower degree of integration than the first CMOSFETs because the second well region 14 has a greater depth than the first well region 12. In the first embodiment, the first CMOSFETs which allow for a higher degree of integration though they are more likely to give rise to the latch-up phenomenon and the second CMOSFETs which tend less to produce the latch-up phenomenon, though handicapped by a low degree of integration, are formed on the surface of the same substrate. With a CMOS device, for example, a RAM, external noise readily enter a peripheral circuit such as a power source circuit and input-output circuit, etc., thereby more likely giving rise to the latch-up phenomenon. Conversely, a memory cell, row decoder and column decoder which collectively occupy 60 to 70% of the whole area of the device are less likely to produce the latch-up phenomenon. If, however, the memory cell and row and column decoder are formed of the first CMOSFETs, and the peripheral circuit is formed of the second CMOSFETs, then the CMOS memory device as a whole is less subject to the latch-up phenomenon, and further, is advantageously saved from a decline in the degree of integration. Therefore, the CMOS device can be manufactured with the aforementioned advantageous effects by the simple process of causing the two well regions to be formed with different depths.

The foregoing description refers to the case where the silicon substrate 10 was chosen to have an N type. However, it is possible to form the first and second well regions in a P type silicon substrate. The depths of the two well regions doped with an impurity at the same concentration are not limited to the previously described values. However, it well serves the purpose of the present invention to choose the second well region to have a depth of 3 to 10 μm and to make the first well region shallower than that depth.

Description will now be given with reference to FIG. 2 of a CMOS device according to a second embodiment of this invention. The parts of the second embodiment the same as those of the first embodiment are denoted by the same numerals and description thereof is omitted. In the second embodiment, first and second P type well regions 12, 14' are formed on the surface region of the N type silicon substrate 10 with the same depth of 5 μm. The first well region 12 is doped with an impurity at a concentration of $7 \times 10^{15}/cm^3$. The second well region 14' is doped with an impurity at a concentration of $1.6 \times 10^{16}/cm^3$. Therefore, the first well region 12 has a resistance of about 9 kΩ per unit area, and the second well region 14' has a resistance of about 4 kΩ per unit area. In other words, both well regions 12, 14' have the same relationship as in the first embodiment in regard to the respective resistance values. The second well region 14' has a lower resistance per unit area than the first well region and CMOSFETs formed in the second well region 14' are less likely to experience the latch-up phenomenon. Thus the second embodiment attains the same effect as the first embodiment by forming the first and second well regions with the same depth which well regions are doped with an impurity of different concentrations to adjust the respective resistances.

In the second embodiment, it is possible to let the substrate and well regions have the opposite conductivity types to those which were previously described. The two well regions having the same depth need not be doped with an impurity at the aforementioned concentrations. It is advised that if the second well region has an impurity concentration of $5 \times 10^{15}/cm^3$ to $8 \times 10^{16}/cm^3$, then the first well region should have a smaller impurity concentration than the above level.

It will be noted that this invention is not limited to the foregoing embodiments. The invention can be practiced with many changes and modifications, provided two well regions are formed on a substrate with different resistances per unit area. As described above, a CMOS device is divided into the peripheral circuit which has a relatively small area and is more likely to give rise to the latch-up phenomenon and the other circuit. These two circuits are respectively formed of the two well regions. This invention enables a CMOS device to be manufactured by a simple process with a high degree of integration and in a state saved from the occurrence of the latch-up phenomenon as a whole.

What is claimed is:

1. A complementary-symmetry MOS RAM-type semiconductor device for use in applications having peripheral systems, the device having a circuit for interacting with the peripheral systems as well as a circuit to provide the RAM function, the device comprising:
    a semiconductor substrate of a first conductivity type;
    a first well region of a second conductivity type which is formed in the surface region of said substrate;
    a second well region of a second conductivity type which is formed in the surface region of said substrate with a smaller resistance per unit area than said first well region;
    a first complementary-symmetry MOS circuit formed of said first well region and substrate; and
    a second complementary-symmetry MOS circuit formed of said second well region and substrate,
    wherein said first complementary-symmetry MOS circuit constitutes the RAM function circuit and said second complementary-symmetry MOS circuit constitutes the peripheral systems interaction circuit, for suppressing the occurrence of latch-up without decreasing the degree of integration of said semiconductor device.

2. A semiconductor device according to claim 1, wherein said first and second well regions are doped with an impurity at the same concentration, and said second well region is formed with a greater depth than said first well region.

3. A semiconductor device according to claim 1, wherein said first and second well regions have the same depth, and said second well region is doped with an impurity at a higher concentration than said first well region.

4. A semiconductor device according to claim 2, wherein said second well region has a depth of 3 to 10 μm, and said first well region is made shallower than said second well region.

5. A semiconductor device according to claim 3, wherein said second well region is doped with an impurity at a concentration of $5 \times 10^{15}$ to $8 \times 10^{16}/cm^3$, and said first well region is doped with an impurity at a lower concentration than said second well region.

* * * * *